(12) United States Patent
Shimoda

(10) Patent No.: US 6,430,325 B1
(45) Date of Patent: Aug. 6, 2002

(54) DEVICE HAVING A LIGHT TRANSMISSION DEVICE

(75) Inventor: Tatsuya Shimoda, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/530,754

(22) PCT Filed: Aug. 27, 1999

(86) PCT No.: PCT/JP99/04664

§ 371 (c)(1), (2), (4) Date: May 4, 2000

(87) PCT Pub. No.: WO00/14813

PCT Pub. Date: Mar. 16, 2000

(30) Foreign Application Priority Data

Sep. 4, 1998 (JP) .............................................. 10-251014

(51) Int. Cl.⁷ ................................................ G02B 6/12
(52) U.S. Cl. ........................... 385/14; 385/11; 385/123
(58) Field of Search ............................ 385/11, 14, 1–9, 385/123–129, 24, 28

(56) References Cited

FOREIGN PATENT DOCUMENTS

| JP | A-47-018350 | 9/1972 |
| JP | A-57-167688 | 10/1982 |
| JP | A-57-181177 | 11/1982 |
| JP | A-61-036982 | 2/1986 |
| JP | A-06-097420 | 4/1994 |
| JP | A-06-097489 | 4/1994 |
| JP | A-06-268254 | 9/1994 |
| JP | A-326348 | 11/1994 |
| JP | A-10-012377 | 1/1998 |
| JP | A-10-153967 | 6/1998 |

*Primary Examiner*—Phan T. H. Palmer
(74) *Attorney, Agent, or Firm*—Oliff & Berridge, PLC

(57) ABSTRACT

The invention provides a device having a light transmission device wherein a light-emitting element, a driving circuit for driving this light-emitting element, a light-receiving element (light-detecting element), a light-guiding path (wave-guiding path) for guiding light from the light-emitting element to the light-receiving element, an amplifying circuit, wiring and a circuit are successively provided on a substrate. The light from the light-emitting element passes through the light-guiding path and is received at the light-receiving element, transferring photoelectricity. The electric signals from the light-receiving element are amplified at the amplifying circuit and are input to the circuit through the wiring. The circuit operates based on these electric signals.

21 Claims, 12 Drawing Sheets

DEVICE HAVING A LIGHT TRANSMISSION DEVICE

BACKGROUND OF THE INVENTION

1. Field of the Invention

The present invention relates to a device having a light transmission device.

2. Description of Related Art

Conventional semiconductor devices (such as, for instance, liquid crystal display elements having TFT elements) connect predetermined elements to elements through electric wiring, and drive circuits by transmitting information only with electric signals.

However, in the conventional devices, there is a problem in that signals are delayed due to the capacity and the wiring resistance of electric wiring (wiring). As semiconductor devices become denser, this signal delay becomes longer, which is a large obstacle to the acceleration of semiconductor devices. There is also the problem of heating due to wiring resistance. Although an information transmission means by light using optical fiber is known, the applications thereof are limited to relatively large devices.

SUMMARY OF THE INVENTION

It is an object of the present invention to provide a device having a light transmission means (or light transmission device) that is different from an information transmission method using electric signals, particularly, a device having a light transmission means that can improve integration and speed.

In order to solve these problems, the present invention provides the device described in the features (1) to (21) hereafter.

(1) A device having a light transmission means includes the light transmission means wherein a light-emitting section having at least one light-emitting element made of a thin film, a light-receiving section having at least one light-receiving element made of a thin film, and a light-guiding path that guides light from the light-emitting section to the light-receiving section are integrated.

(2) According to the device described in (1), the light-emitting section, the light-receiving section and the light-guiding path are arranged in at least a one-dimensional direction.

(3) According to the device described in (1) or (2), the light-emitting section, the light-receiving section and the light-guiding path are arranged on the same substrate.

(4) According to the device described in (1), the light-emitting section, the light-receiving section and the light guiding path are arranged in a two-dimensional direction.

(5) According to the device described in (1), the light-emitting section, the light-receiving section and the light-guiding path are arranged in a three-dimensional direction.

(6) According to the device described in (5), a layer having at least one of the light-emitting section, the light-receiving section and the light-guiding path is laminated.

(7) According to the device described in any of (1) to (6), the light-emitting section has a plurality of light-emitting elements with different light-emitting characteristics.

(8) According to the device described in any of (1) to (6), the light-emitting section has a plurality of light-emitting elements with different peak wavelengths of emitted light.

(9) According to the device described in (7) or (8), the light-receiving section has a plurality of light-receiving elements that receive light from the corresponding light-emitting elements.

(10) According to the device described in any of (1) to (9), at least one thin film constituting the light-emitting element is patterned by an ink jet method.

(11) According to the device described in any of (1) to (10), the light-emitting element is composed of an organic EL element.

(12) According to the device described in any of (1) to (10), the light-emitting element is composed of an organic EL element and an optical filter.

(13) According to the device described in (12), the optical filter is a distributed reflection multilayer film mirror made of a plurality of laminated thin films having different refractive indexes.

(14) According to the device described in any of (1) to (13), at least one thin film composing the light-receiving element is patterned by an ink jet method.

(15) According to the device described in any of (1) to (14), the light-receiving element is composed of an organic element.

(16) According to the device described in any of (1) to (14), the light-receiving element is composed of an organic element and an optical filter.

(17) According to the device described in any of (1) to (16), the light-guiding path is composed of thin films.

(18) According to the device described in any of (1) to (17), at least one thin film compsoing the light-guiding path is patterned by an ink jet method.

(19) The device according to any of (1) to (18) has a thin film transistor.

(20) The device according to any of (1) to (18) has a plurality of circuit blocks on the same substrate, wherein each of the plurality of circuit blocks has the light-emitting section and the light-receiving section.

(21) According to the device described in (20), a gap between predetermined circuit blocks of the plurality of circuit blocks is connected by the light-guiding path, wherein signals are transmitted and received by light through the light-guiding path between the circuit blocks.

DESCRIPTION OF THE PREFERRED EMBODIMENTS

A device having a light transmission means (or light transmission device) of the present invention is explained hereafter, below in detail based on the preferred embodiments shown in the attached figures.

Figure 1:
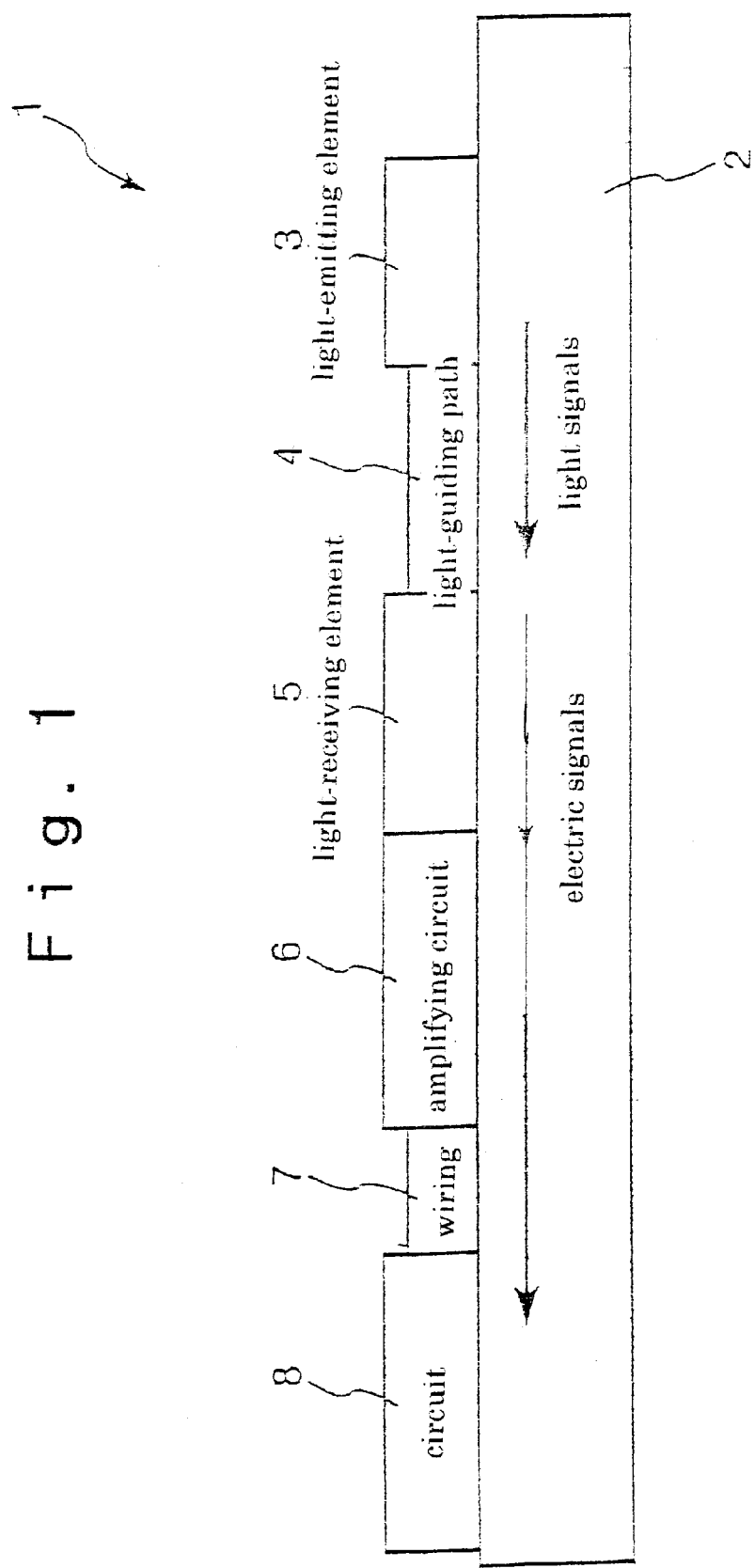
FIG. 1 is a type view, showing major sections of a device having a light transmission means of one embodiment of the present invention.

FIG. 1 is a type view, showing major sections of a device having a light transmission means of one embodiment of the present invention.

A device (semiconductor device) 1 shown in the figure has a substrate 2. Placed on this substrate 2 are a light-emitting element 3, a circuit (a circuit on the transmission side) that has a driving circuit 3 not shown in the figure for driving this light-emitting element 3 and that sends signals to the light-emitting element 3, a light-receiving element (light-detecting element) 5, a light-guiding path (wave-guiding path) 4 for guiding the light from the light-emitting element 3 to the light-receiving element 5, an amplifying circuit 6, a wiring (electric wiring) 7, and a circuit 8.

Specifically, integrated on the substrate 2 are the light-emitting element 3, each element and the wiring thereof constituting the circuit that has the driving circuit and sends signals, the light-guiding path 4, the light-receiving element 5, each element and the wiring thereof constituting the amplifying circuit 6, the wiring 7, and each element and the wiring thereof constituting the circuit 8.

Materials for the substrate 2 include, for instance, various glasses, Si monocrystals, ceramics, quartz and so forth.

Moreover, each of the light-emitting element 3, the light-guiding path 4 and the light-receiving element 5 are partially or totally made of a thin film.

The light-emitting section is constituted of the light-emitting element 3; the light-receiving section is formed of the light-receiving element 5; and the light transmission means is made up of the light-emitting element 3, the light-guiding path 4 and the light receiving element 5.

For instance, an organic EL element can be used as the light-emitting element 3 in this device 1. As the light-receiving element 5, a photodiode or the like may be used.

Figure 2:
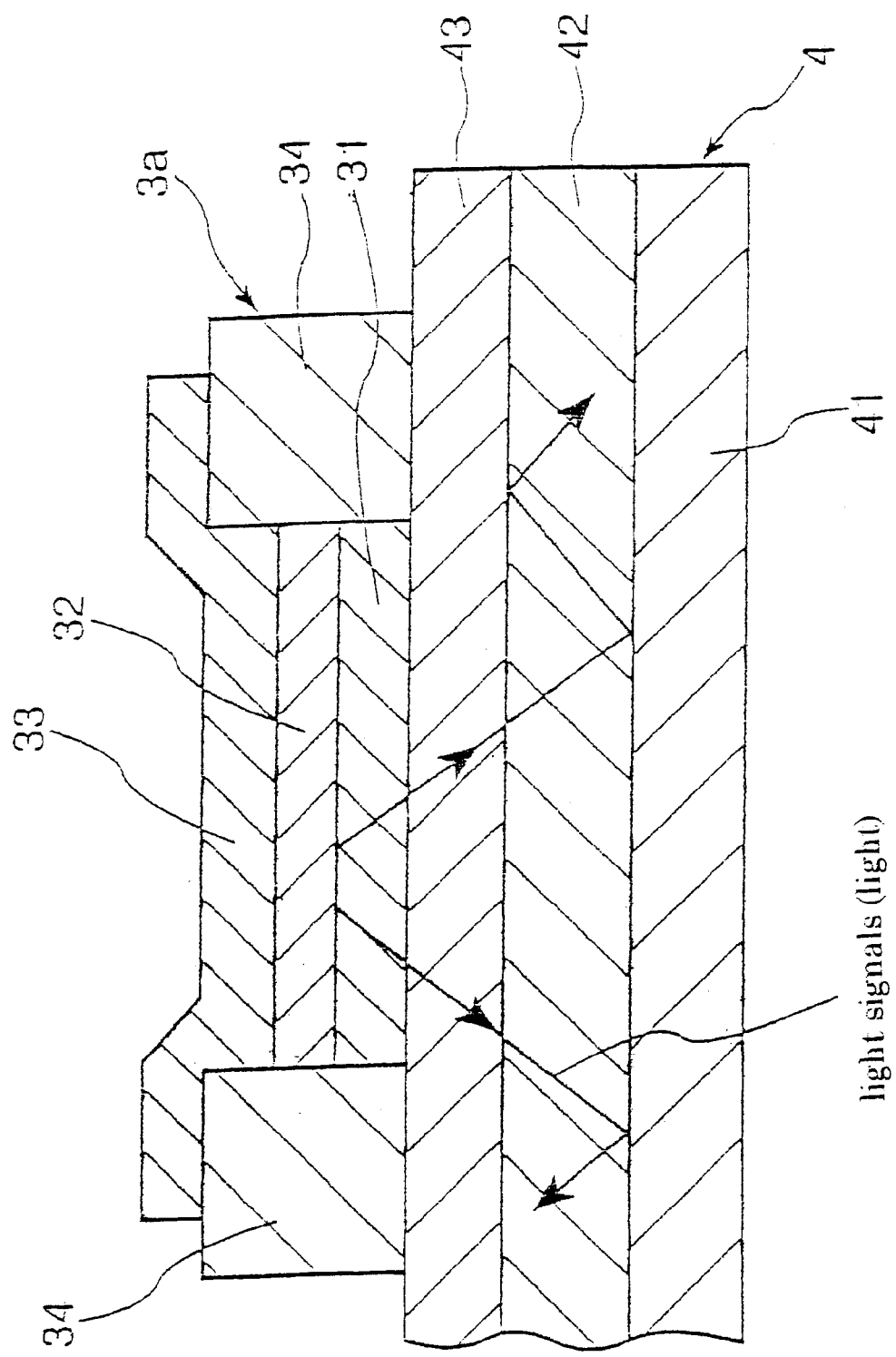
FIG. 2 is a cross-sectional view, showing a configuration of an organic EL element used as a light-emitting element and a configuration of a light-guiding path in the present invention.

FIG. 2 is a cross-sectional view, showing a configuration of an organic EL element used as the light-emitting element 3 and a configuration of the light-guiding path 4.

As shown in the figure, the organic EL element 3a is constituted of a transparent electrode 31, a light-emitting layer (organic EL layer) 32, a metal electrode 33 and banks 34 used as shielding sections as well as walls for preventing the ink from spreading. This organic EL element 3a is placed on a light-guide path 4, which is explained below. The configuration of the organic EL element 3a will be explained below in detail.

The banks 34 are formed on the $SiO_2$ layer 43 of the light-guiding path 4 described below. Each of the transparent electrode 31 and the light-emitting layer 32 is formed on the inner side of the banks 34. In this case, the transparent electrode 31 is formed on the $SiO_2$ layer 43, and the light-emitting layer 32 is formed on the transparent electrode 31. Moreover, the metal electrode 33 is formed on the banks 34 and the light-emitting layer 32.

The transparent electrode 31 is made of, for instance, ITO or the like. Moreover, the thickness of the transparent electrode 31 is preferably about 50 to 500 nm.

For the light-emitting layer 32, organic light-emitting materials are applied as a light-emitting material. In this case, the flexibility in selecting light-emitting wavelengths is significant; indeed, various wavelengths can be selected by selecting particular materials or by mixing materials.

As organic light-emitting material, a material is selected wherein the energy of excitation in the light-emitting material is equivalent to the energy difference between the HOMO (highest occupied level) and the LUMO (lowest unoccupied level) corresponding to the forbidden bandwidth of the organic material. For example, low-molecules, macromolecules, conjugate macromolecules with conjugate development particularly at principal chains, conductive macromolecules and pigment molecules are chosen.

When low-molecular organic materials are used as the organic light-emitting material, anthracene, PPCP, Zn $(OxZ)_2$, disutyl benzene (DSB), the derivatives thereof (PESB), and so forth are used to emit, for instance, blue light. Additionally, in order to emit e.g., green light, $Alq_3$, coronene, and so forth are used. Moreover, BPPC, perylene, DCM, and the like are applied to emit e.g., red light.

Also, when high-molecular organic light-emitting materials are applied as organic light-emitting materials, applied are PAT and the like to emit e.g., red light, MEH-PPV and so forth to emit orange light, PDAF, FP-PPP, RO-PPP, PPP or the like to emit blue light, and PMPS or the like to emit purple light.

As other organic light-emitting materials, PPV, RO-PPV, CN-PPV, PdPhQx, PQx, PVK (poly (N-vinylcarvazol)), PPS, PNPS, PBPS, and the like are applied.

Particularly, PVK can vary light-emitting wavelengths (luminescent colors) by controlling the mixed concentration and the discharge frequency of dopant ink of pigment molecules having poor carrier ability such as Eu complex. For instance, when a fluorescent pigment is doped into an organic light-emitting material comprising PVK, luminescent colors may be arranged. As the pigments of 1,1,4,4-tetraphenyl-1,3,-butadiene (TPB), coumarin 6 and DCM1 are doped into PVK, luminescent colors may be blue, green and orange, respectively. Moreover, when three types of pigments are doped to PVK at the same time, a wide spectrum can be provided. If rhodamine B or DCM can be doped into PPV, luminescent colors may be selectively varied from green to red.

Preferably, a composition for an organic EL element (a composition for the light-emitting layer 32) is heated wherein mainly the precursor of conjugate high-molecular organic compounds forming the light-emitting layer 32 itself, or the precursor and fluorescent pigments or the like are dissolved or dispersed in a predetermined solvent so as to vary light-emitting characteristics of the light-emitting layer 32. The precursor in the composition for the organic EL element is formed in a polymerized thin film (solid thin film). Alternatively, as another example, the light-emitting layer 32 is formed of a high-molecular thin film by drying or heating a composition (a composition for the light-emitting layer 32) wherein conjugate macromolecules themselves that are soluble in an organic solvent, or the conjugate macromolecules and fluorescent pigments or the like so as to vary light-emitting characteristics of the light-emitting layer 32 are dissolved. The thickness of the light-emitting layer 32 is preferably about 50 to 500 nm.

For the metal electrode 33, for instance, Al—Li or the like is applied. Additionally, the thickness of the metal electrode 33 is preferably about 10 to 500 nm.

For the banks 34, for example, polyimide, $SiO_2$, or the like is used. Moreover, the bank 34 is preferably thicker than the total thickness of the transparent electrode 31 and the light-emitting layer 32.

As mentioned above, on the substrate 2 shown in FIG. 1, the circuit on the transmission side is provided that has a driving circuit not shown in the figure for driving the organic EL element 3a. Moreover, when a predetermined voltage is applied between the transparent electrode 31 and the metal electrode 33 from the driving circuit at this organic EL element 3a, electrons and holes are injected into the light-emitting layer 32. They shift inside the light-emitting layer 32 due to the increased power by applied voltage, and are recombined. Excitation occurs due to this recombination, and releases energy (fluorescence and phosphorescence) when it returns to a base state. In other words, light is emitted. Such a phenomenon is called EL emission.

The method of manufacturing the organic EL element 3a will now be explained. In this embodiment, the organic EL element 3a having the configuration shown in FIG. 2 is manufactured by ink jet printing.

Figure 3:
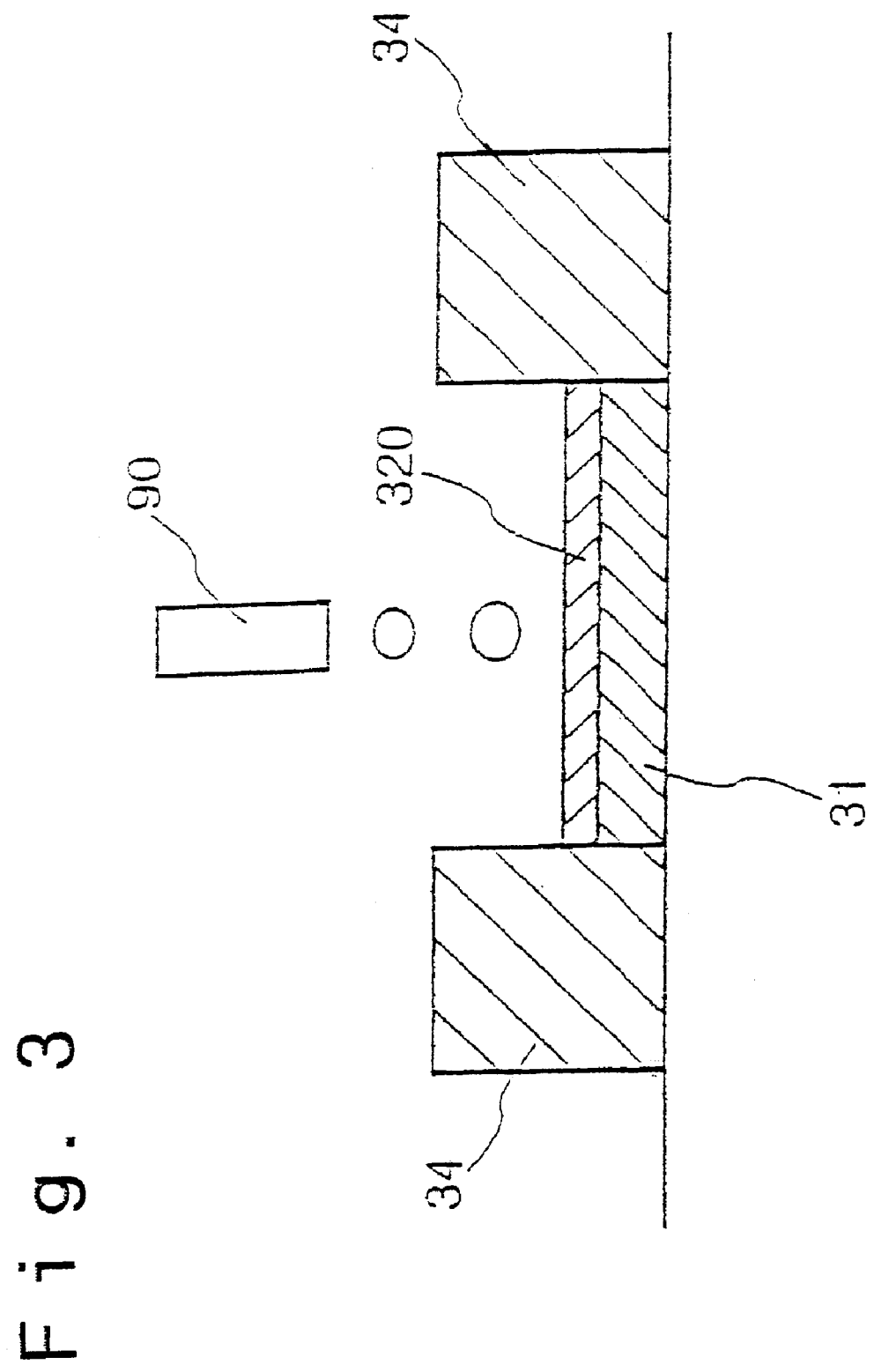
FIG. 3 is a view to explain a method of manufacturing organic EL elements by ink jet printing.

This manufacturing method by ink jet printing is a method of discharging (ejecting) a predetermined composition (a discharge solution) from a head, patterning a predetermined thin film (layer) material and solidifying it into a thin film in the ink jet method. The method of manufacturing the organic EL element 3a by ink jet printing is explained in detail hereafter, with reference to FIG. 3.

As shown in the figure, first, the banks 34 are formed, for instance, by photolithography. Then, the composition for the transparent electrode 31 prepared in advance is formed in a pattern on the light-guiding path 4 by the ink jet method. Specifically, the composition for the transparent electrode 31 is ejected from a nozzle 90 of a head for ink jet, thus forming predetermined patterns. Then, the patterned composition for the transparent electrode 31 is heated and solidified, thereby forming the transparent electrode 31.

Subsequently, the composition for the light-emitting layer 31 prepared in advance is patterned by the ink jet method. Specifically, the composition for the light-emitting layer 32 is discharged from a nozzle 90 of a head for ink jet, thus forming a predetermined pattern. Then, a layer 320 of the composition for this patterned light-emitting layer 32 is heated, and the precursor of a conjugate high-molecular organic compound in the layer 320 is polymerized. In other words, the layer 320 is solidified, thus forming the light-emitting layer 32.

Finally, the electrode 33 is formed by, for instance, a sputtering or deposition method, thus providing the organic EL element 3a having the configuration shown in FIG. 2.

According to the ink jet printing, in other words, the ink jet method, fine patterning may be easily, quickly and precisely carried out, so that light-emitting properties such as the conditions, coloring balance and brightness can be easily and freely controlled.

Therefore, the organic EL element 3a having preferable characteristics, size and patterns can be easily formed on the substrate 2 where particularly fine elements such as TFT (thin film transistor) circuits or general monocrystal Si base ICs are integrated.

The light-guiding path 4 having the configuration shown in FIG. 2 is constituted of an $SiO_2$ layer 41, an $SiO_2$ layer 43, and an ITO layer 42 provided between the $SiO_2$ layer 41 and $SiO_2$ layer 43. In this case, the $SiO_2$ layer 41 is formed on the substrate 2. The thickness of the $SiO_2$ layer 41 is preferably about 50 nm to 10 $\mu$m. The thickness of the ITO layer 42 is preferably about 30 nm to 10 $\mu$m. The thickness of the $SiO_2$ layer 43 is preferably about 50 nm to 10 $\mu$m.

As shown in FIG. 1, this light-guiding path 4 extends at least from the organic EL element 3a (light-emitting element 3) to a PIN photodiode 5a (light-receiving element 5), explained hereafter, and guides the light from the organic EL element 3a to the PIN photodiode 5a.

The light-guiding path 4 can be manufactured by conventional methods of forming thin films (CVD, PVD and the like) and photolithography.

Furthermore, the light-guiding path 4 may also be manufactured by ink jet printing as the organic EL element 3a mentioned above. Specifically, at least one thin film (layer) constituting the light-guiding path 4 is manufactured by patterning a predetermined composition in the ink jet method and then solidifying it, as the organic EL element 3a mentioned above. In this case, the above-described effects by ink jet printing can be obtained.

On the other hand, as the light-receiving element 5 having the configuration shown in FIG. 1, for instance, a PIN photodiode may be used.

Figure 4:
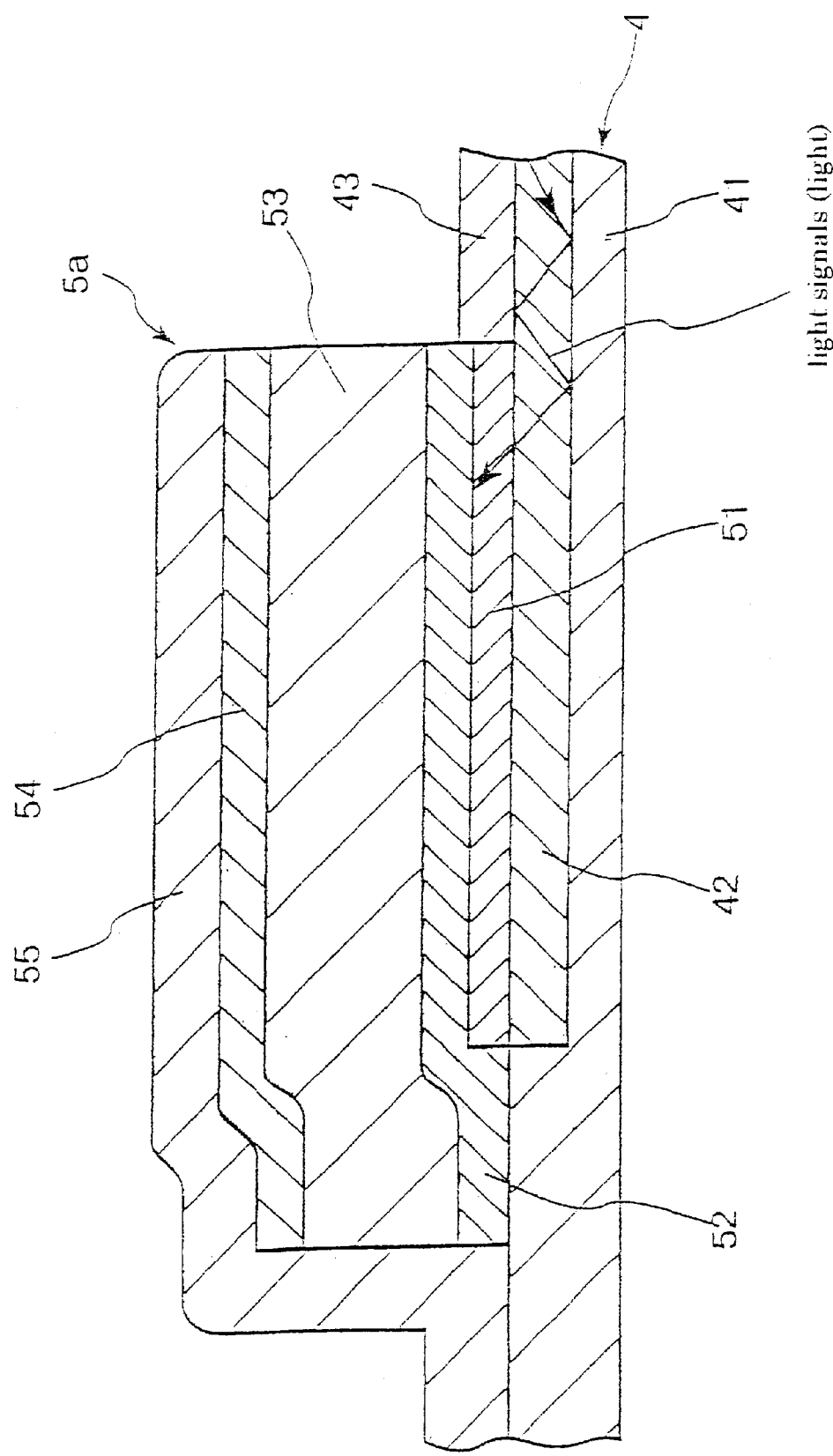
FIG. 4 is a cross-sectional view, showing a configuration of a PIN photodiode used as a light-receiving element and a configuration of a light-guiding path in the present invention.

FIG. 4 is a cross-sectional view, showing the configuration of the PIN photodiode used as the light-receiving element 5 and a configuration of the light-guiding path 4.

As shown in the figure, the PIN photodiode 5a is formed of a light-receiving window electrode 51, a p-type a-SiC layer (p-type semiconductor layer) 52, an i-type a-Si layer (semiconductor layer) 53, an n-type a-SiC layer (n-type semiconductor layer) 54, and an Al—Si—Cu layer 55 used as a light-receiving top electrode as well as wiring (electric wiring).

These light-receiving window electrode 51, p-type a-SiC layer 52, i-type a-Si layer 53, n-type a-SiC layer 54, and Al—Si—Cu layer 55 are laminated successively from the bottom in FIG. 4.

This PIN photodiode 5a is provided on the light-guiding path 4 so as to make the light-receiving window electrode 51 face the ITO layer 42 of the light-guiding path described above. Additionally, the $SiO_2$ layer 43 is not formed at the section corresponding to the light-receiving window electrode 51 of the light-guiding path 4.

The light-receiving window electrode 51 is formed of, for example, ITO or the like. The thickness of this light-receiving window electrode 51 is preferably about 50 nm to 1 $\mu$m.

Moreover, as an example, the thickness of the p-type a-SiC layer 52, the i-type a-Si layer 53, the n-type a-SiC layer 54 and the Al—Si—Cu layer 55 is 50 nm, 80 nm, 50 nm and 1 $\mu$m, respectively.

However, the above-mentioned thickness of each layer is not limited to the value mentioned above. Specifically, the thickness of each layer is significantly variable. The thickness of each layer is flexible.

This PIN photodiode 5a may be manufactured by ink jet printing as the organic EL element 3a described above. Specifically, at least one thin film (layer) constituting the PIN photodiode 5a can be manufactured by patterning a predetermined composition in the ink jet method and solidifying it, as the above-described organic EL element 3a. In this case, the above-mentioned effects by ink jet printing can be provided.

Also, in the present invention, organic photo detective materials (organic elements) may be applied in addition to the PIN photodiode 5a mentioned above. As these organic photo detective materials, for example, the same material as the above-described organic EL element 3a may be used. For example, a mixture of PPV and cyano-PPV, or the like may be used.

As shown in FIG. 1, to the PIN photodiode 5a mentioned above, an input side of the amplifying circuit 6 is connected.

Figure 5:
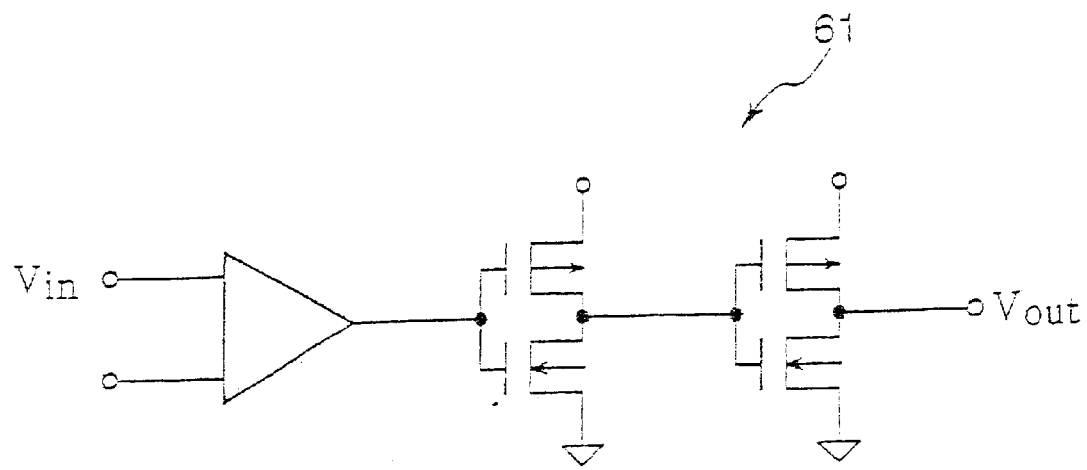
FIG. 5 is a circuit view, showing a configuration of an amplifying circuit in the present invention.
Figure 6:
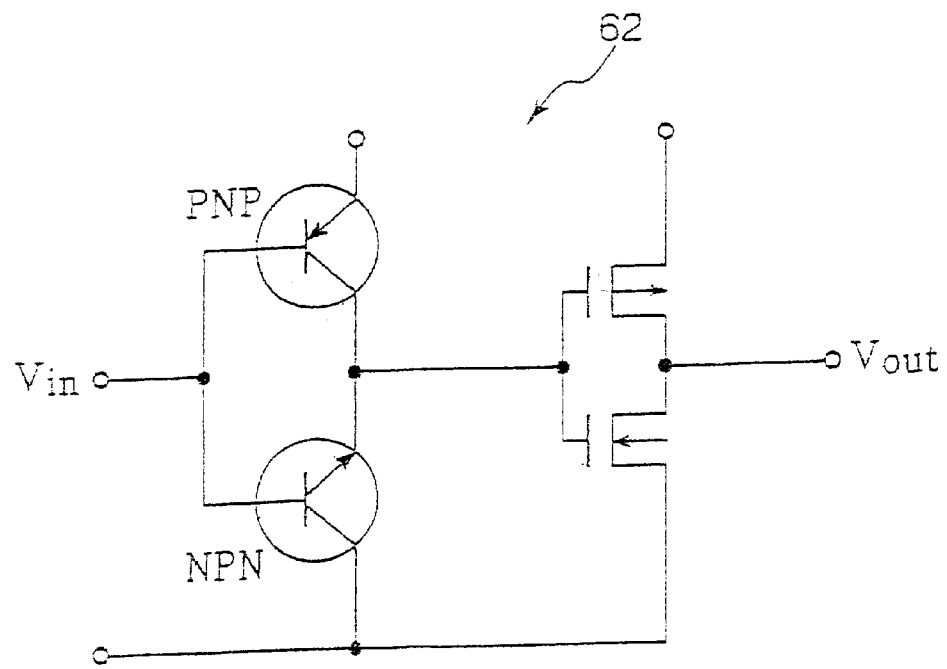
FIG. 6 is a circuit view, showing another configuration of an amplifying circuit in the present invention.
Figure 7:
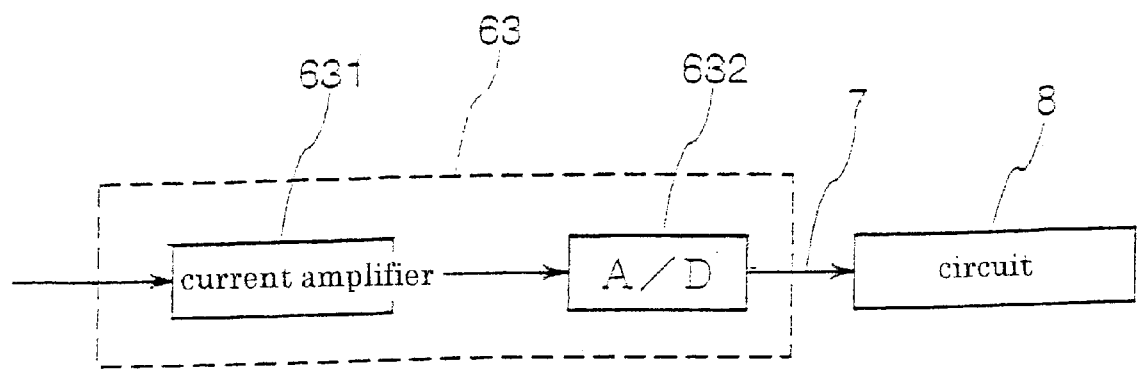
FIG. 7 is a block view, showing another configuration of an amplifying circuit in the present invention.
Figure 8:
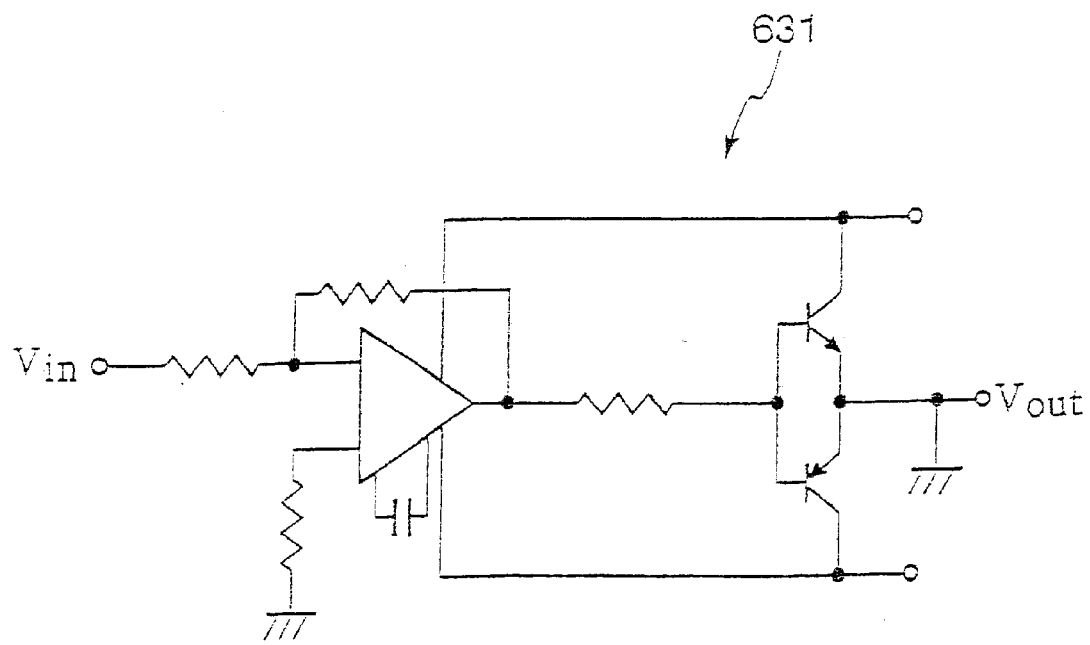
FIG. 8 is a circuit view, showing a configuration of a current amplifier in the present invention.

The amplifying circuit 6 includes, for instance, a CMOS type digital amplifying circuit 61 having a P-channel and an N-channel MOS-FET (field effect transistor) shown in FIG. 5, a Bi-CMOS type digital amplifying circuit 62 having a bipolar transistor and an MOS-FET shown in FIG. 6, and an amplifying circuit 63 constituted of a current amplifier (analog amplifying circuit) 631 shown in FIG. 7 and FIG. 8 and an A/D converter 632, and so forth.

Additionally, in the case of the amplifying circuit 63, electric signals (analog signals) are input to the current amplifier 631, and are input to the A/D converter 63 after the current values (signal level) thereof are amplified. Subsequently, these amplified signals are converted from analog signals to digital signals by the A/D converter 632, and are output.

On the other hand, as shown in FIG. 1, to the output side of the above-described amplifying circuit 6, is connected the predetermined circuit 8 through the wiring 7. The circuit 8 includes, for instance, a circuit having an FET (field effect transistor) formed on an Si monocrystal, and a circuit having a TFT (thin film transistor), and the like. The operation of the device 1 will now be explained.

As described above, at the circuit on the transmission side not shown in FIG. 1, the transmitted (generated) electric signals are input into the driving circuit, and the driving circuit drives the organic EL element 3a (light-emitting element 3) based on the electric signals and emits light. Accordingly, light signals (light) are generated. In other words, the organic EL element 3a is driven by the driving circuit, converting the electric signals into light signals (light) and sending (transmitting) them.

In this case, as shown in FIG. 2, the light from the light-emitting layer 32 of the organic EL element 3a transmits the transparent electrode 31 and the SiO$_2$ layer 43 as shown in the arrows in FIG. 2, and then enters the ITO layer 42. Subsequently, the light is repeatedly reflected at an interface between the SiO$_2$ layer 41 and the ITO layer 42 and an interface between the SiO$_2$ layer 43 and the ITO layer 42, and travels inside the ITO layer 42 toward the PIN photodiode 5a (light-emitting element 5).

As illustrated in FIG. 4, the light from the organic EL element 3a enters from the light-emitting window electrode 51 as shown in the arrows in FIG. 4. In other words, the light is received at the PIN photodiode 5a.

Subsequently, from the PIN photodiode 5a, the electric current corresponding to the quantity of received light, in other words, electric signals (signals) are output. (Light signals are converted into electric signals and then output.) The signals from the PIN photodiode 5a are amplified at the amplifying circuit 6, and are input to the circuit 8 through the wiring 7. The circuit 8 operates based on these signals.

As explained above, according to this device 1, information (signals) are transmitted mainly by optical communication in the device 1 wherein fine elements are integrated, thus preventing heating caused by the resistance of electric wiring between the organic EL element 3a and the PIN photodiode 5a. Accordingly, the heating from the device 1 can be reduced.

Moreover, since there is no signal delay between the organic EL element 3a and the PIN photodiode 5a, a device (circuit) with good response properties can be provided.

Moreover, if the organic EL element 3a, the light-guiding path 4, the PIN photodiode 5a, and the like are formed on the substrate 2 by ink jet printing, the productivity of the device 1 improves, which is advantageous to mass production.

Now, the device having a light transmission means of another embodiment of the present invention will be explained. In the device (semiconductor device) shown in FIG. 9, a light-emitting section is composed of a plurality (three in this embodiment) of light-emitting elements 30 having different light-emitting characteristics (peak wavelengths of emitting light in this embodiment), and the light-receiving section is made up of a plurality (three in this embodiment) of light-receiving elements 50 receiving light from the corresponding light-emitting elements 30. Due to this configuration, a plurality (three kinds in this embodiment) of information (signals) may be transmitted at the same time by using the same light-guiding path 4. The device 10 is explained hereafter, in detail.

Figure 9:
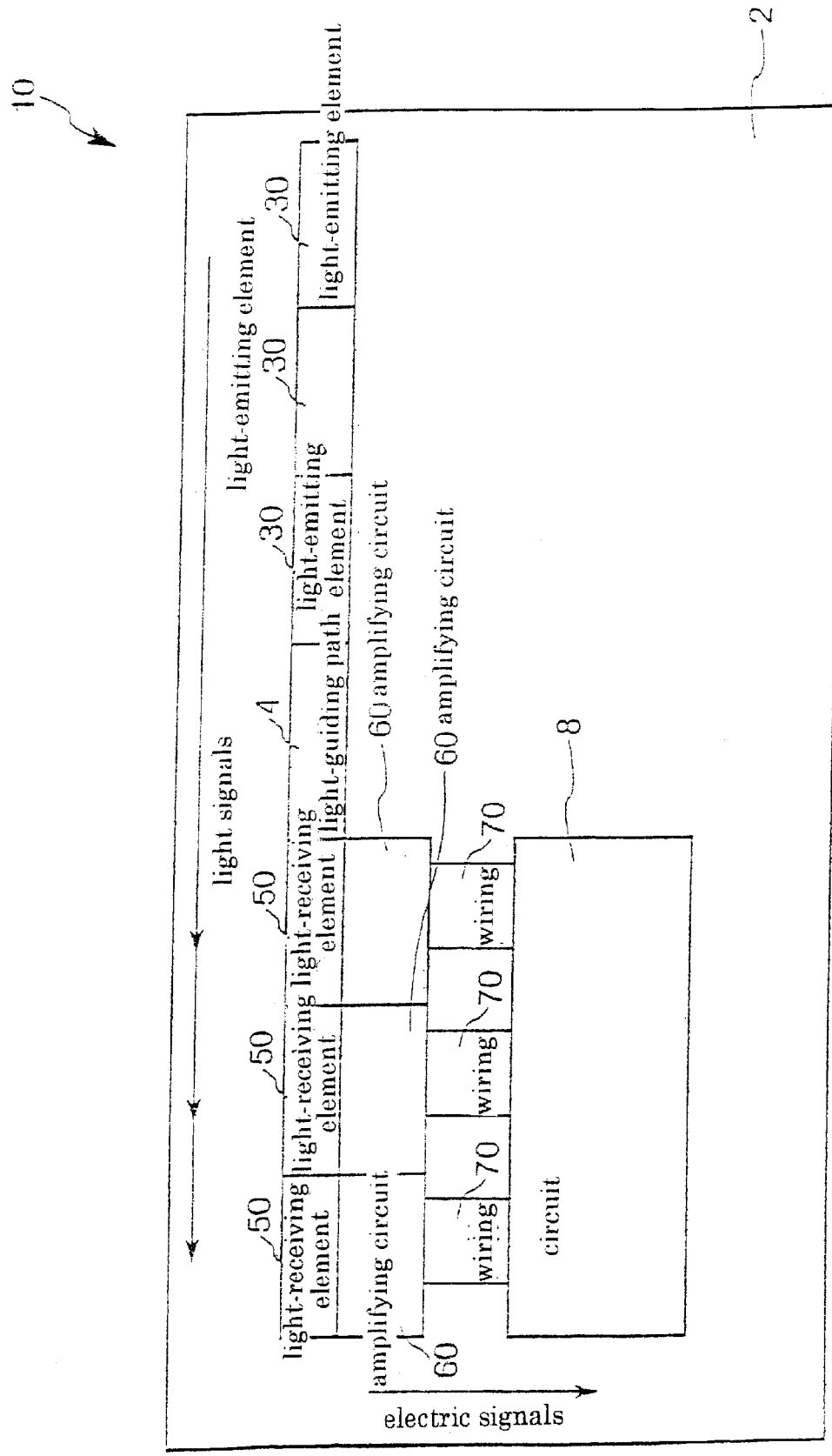
FIG. 9 is a type view, showing major sections of a device having a light transmission means of another embodiment of the present invention.

As shown in FIG. 9, the device 10 has a substrate 2. Provided on this substrate 2 are a plurality (three in this embodiment) of light-emitting elements 30, driving circuits for driving each light-emitting element 30 not shown in the figure, a plurality (three in this embodiment) of light-receiving elements (photo detective elements) 50, the light-guiding path (wave-guiding path) 4 that guides the light from the light-emitting elements 30 to the light-receiving elements 50, a plurality (three in this embodiment) of amplifying circuits 60, a plurality (three in this embodiment) of wirings (electric wirings) 70, and a circuit 8.

Specifically, on the substrate 2, integrated are three light-emitting elements 30, each element and the wiring thereof constituting the driving circuits, the light-guiding path 4, three light-receiving elements 50, each element and the wiring thereof constituting three amplifying circuits 60, three wirings 70, and each element and the wiring thereof constituting the circuit 8.

Materials for the substrate 2 include, for example, various glasses, Si monocrystals, ceramics, quartz, and the like.

Moreover, each of the light-emitting elements 30, the light-guiding path 4 and the light-receiving element 50 are partially or totally made of a thin film.

As described above, each light-emitting element 30 in this device 10 has different peak wavelengths of emitting light. The peak wavelengths of the emitting light from the three light-emitting elements 30 are supposed to be $\lambda 1$, $\lambda 2$ and $\lambda 3$, respectively. It is preferable that these $\lambda 1$, $\lambda 2$ and $\lambda 3$ are separated from each other to some degree so as to selectively receive light on the side of the light-receiving elements 50.

Each light-emitting element 30 in this device 10 may be formed by changing the materials and compositions of the organic EL layer (light-emitting layer 32) or changing filter characteristics.

Figure 10:
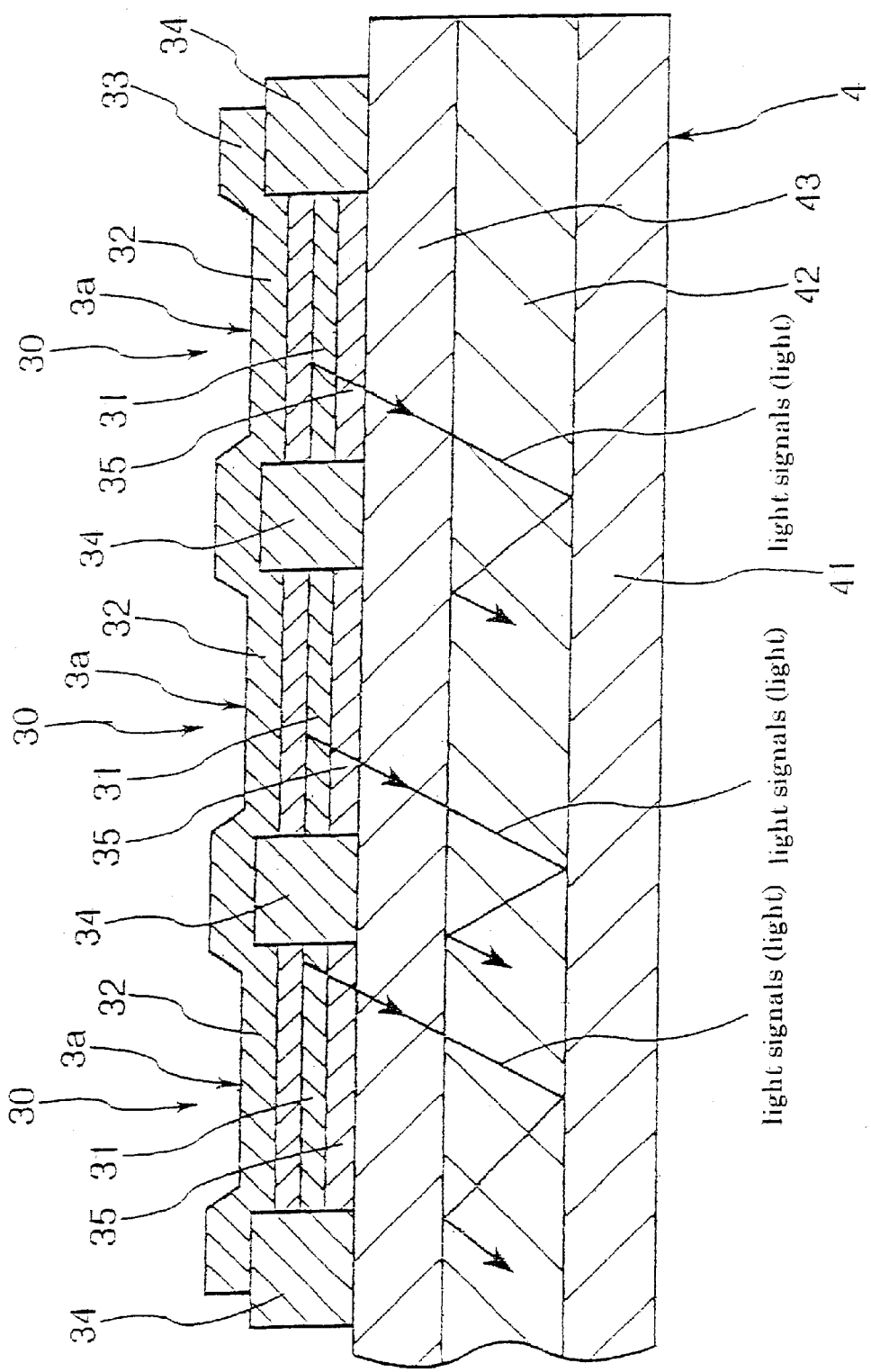
FIG. 10 is a cross-sectional view, showing a configuration of a light-emitting element and a light-guiding path in the present invention.

FIG. 10 is a cross-sectional view, showing a configuration of light-emitting elements 30 and a configuration of a light-guiding path 4. As illustrated in the figure, each light-emitting element 30 is made up of an organic EL element 3a that is formed of a light-emitting layer (organic EL layer) 32, a metal electrode 33 and a bank 34 used as a shielding section as well as a wall to prevent ink from spreading, and an optical filter 35. Each light-emitting element 30 is provided on the light-guiding path described later.

The configuration of the light-emitting element 30 is explained in detail hereafter. Banks 34 are formed on the $SiO_2$ layer 43 of the light-guiding path 4 described hereafter.

Additionally, each transparent electrode 31, light-emitting layer 32 and optical filter 35 are formed inside banks 34. In this case, an optical filter 35 is formed on the $SiO_2$ layer 43; a transparent electrode 31 is formed on the optical filter 35; and a light-emitting layer 32 is formed on the transparent electrode 31.

Subsequently, the metal electrode 33 is formed on the banks 34 and the light-emitting layers 32. This metal electrode is a common electrode for each organic EL element 3a.

The light-emitting layers 32 will now be described. By using organic light-emitting materials as light-emitting material, the flexibility in selecting light-emitting wavelengths is large; indeed, the choice of various wavelengths is possible by selecting particular materials and mixing materials. As organic light-emitting materials, a material is selected wherein the energy of excitation in the light-emitting material is equivalent to an energy difference between HOMO (highest occupied level) and LUMO (lowest unoccupied level) corresponding to the forbidden bandwidth of the organic material. For example, low-molecules, macromolecules, conjugate macromolecules with conjugate development particularly at principal chains, conductive macromolecules and pigment molecules are chosen. Specifically, it is possible to appropriately select materials that were used as examples for the light-emitting layer 32 at the organic EL element 3a having the configuration shown in FIG. 2, in response to desirable wavelengths.

Moreover, the wavelength (peak wavelength, wavelength band and the like) of the light obtained from a light-emitting layer is also adjustable to some extent by the optical filter 35.

In case of emitting the light with a wide wavelength band (band) as white light and controlling the wavelength, a general absorption type optical color filter (color filter) can be used as the optical filter 35, and only light with a preferable color (wavelength) may be transmitted thereby, thus generating light signals.

As the optical filter 35, for instance, there is a distributed reflection multilayer film mirror (DBR mirror). For example, the light emitted from the organic EL element 3a generally has a wavelength band (the width of a wavelength) of 100 nm or wider. However, when a DBR mirror is used as the optical filter 35, this wavelength may be narrow-banded. (The width of a wavelength may be narrowed). Additionally, if a plurality of DBR mirrors is used, a plurality of lights with different peak wavelengths and sharp peaks can be obtained from the light having a wavelength band of e.g., about 100 nm.

Therefore, by changing the materials of the light-emitting layers 32 of the organic EL elements 3a, the peak wavelengths of each light-emitting element 30 can be set at $\lambda 1$, $\lambda 2$ and $\lambda 3$, respectively. Also, by changing the optical filters 35, the peak wavelengths of each light-emitting element 30 may be set at $\lambda 1$, $\lambda 2$ and $\lambda 3$, respectively.

However, it is preferable to set the peak wavelengths of each light-emitting element 30 at $\lambda 1$, $\lambda 2$ and $\lambda 3$, respectively, by changing the materials of the light-emitting layers 32 of the organic EL elements 3a and also by changing the optical filters 35.

The DBR mirror mentioned above is the lamination of a plurality of thin films having different refractive indexes, particularly, the mirror having a plurality of pairs comprising two kinds of thin films with different refractive indexes (the mirror which is periodically laminated).

The materials of the thin films for the DBR mirror include, for instance, semiconductor materials, dielectric materials, and so forth. Among these, dielectric materials are preferable. They can be formed by a general vacuum film forming method. Moreover, the organic compound soluble in an organic solvent can be applied as a starting material for the dielectric material, which is easily applicable to patterning in the above-mentioned ink jet method.

The organic EL element 3a of each light-emitting element 30 may also be manufactured by ink jet printing, as in the above-described organic EL element 3a of the device 1. Specifically, at least one thin film (layer) constituting the organic EL element 3a of each light-emitting element 30 may be manufactured by patterning a predetermined composition in the ink jet method and solidifying it, as the above-mentioned organic EL element 3a of the device 1. In this case, the effects by ink jet printing mentioned above can be obtained.

Additionally, thin films constituting the DBR mirror (optical filter 35) of each light-emitting element 30 may be formed by the liquid-phase film forming method.

The liquid-phase film forming method is a method in which a thin film material (coating solution) is a (liquid) composition having the components of the thin film dissolved or dispersed in a solvent, and a thin film is formed without evaporating the thin film material.

More preferably, each DBR mirror may be manufactured by ink jet printing as with the above-mentioned organic EL element 3a of the device 1. Specifically, each thin film constituting each DBR mirror can be manufactured by patterning the composition mentioned above in the ink jet method and solidifying it as the above-noted organic EL element 3a of the device 1. In this case, the above-described effects by ink jet printing can be obtained.

As illustrated in FIG. 10, the light-guiding path 4 is constituted of an $SiO_2$ layer 41, an $SiO_2$ layer 43, and an ITO layer 42 provided between the $SiO_2$ layer 41 and the $SiO_2$ layer 43. In this case, the $SiO_2$ layer 41 is formed on the substrate 2. The thicknesses of the $SiO_2$ layer 41, the ITO layer 42, and the $SiO_2$ layer 43 are the same as those of the device 1 mentioned above.

As shown in FIG. 9, this light-guiding path 4 extends at least from each light-emitting element 30 to each light-receiving element 50, and guides the light from each light-emitting element 30 to the corresponding light-receiving element 50.

The light-guiding path 4 may also be manufactured using ink jet printing as the organic EL element 3a mentioned above. Specifically, at least one thin film (layer) constituting the light-guiding path 4 is manufactured by patterning a predetermined composition in the ink jet method and then solidifying it, as the organic EL element 3a mentioned above. In this case, the above-described effects by ink jet printing can be obtained.

The light-receiving element 50 may be made up of, for instance, a PIN photodiode and a predetermined optical filter, and may also be constituted of the same organic element and predetermined optical filter as those for the above-mentioned device 1.

Figure 11:
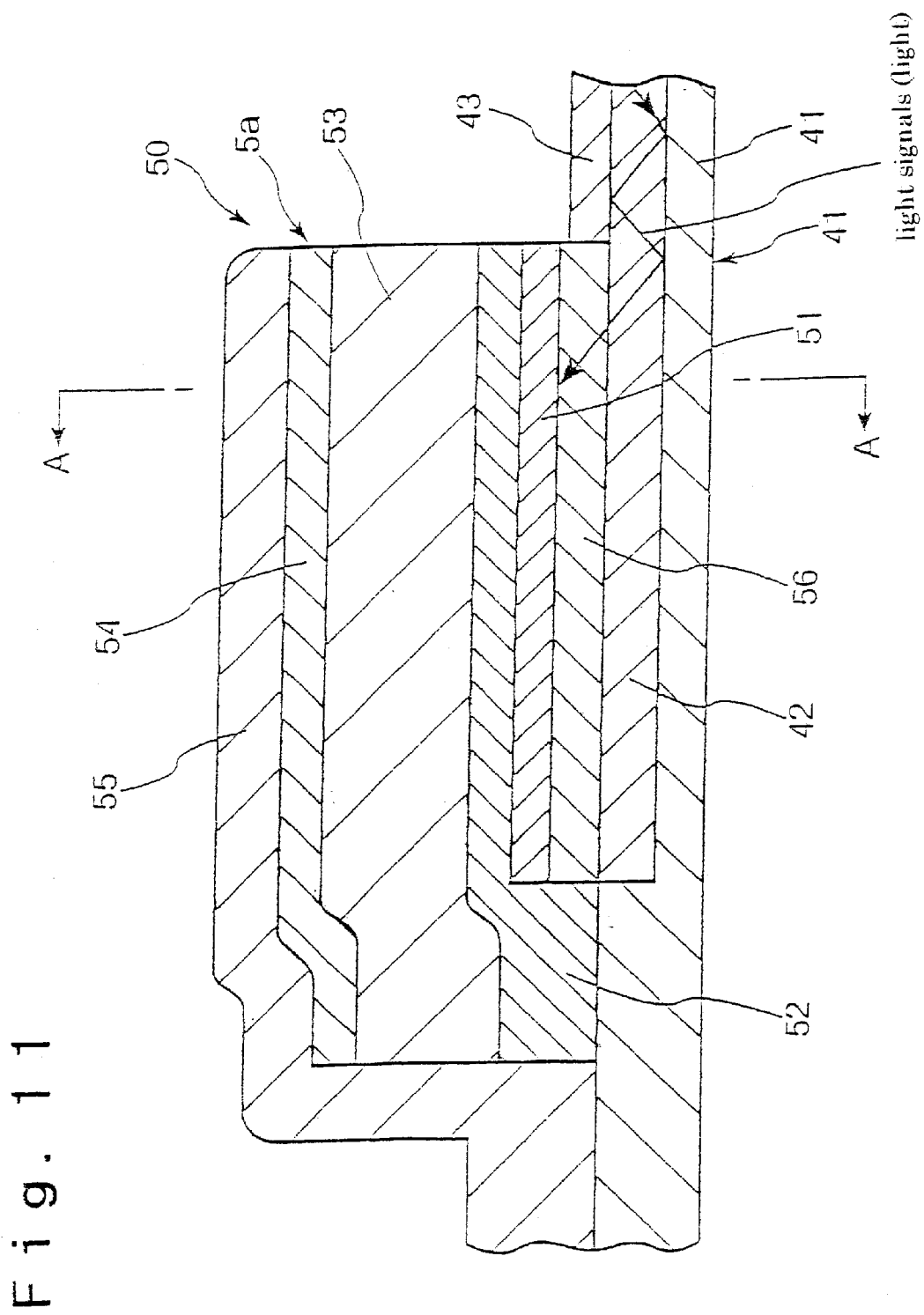
FIG. 11 is a cross-sectional view, showing a configuration of a light-emitting element and a light-guiding path in the present invention.
Figure 12:
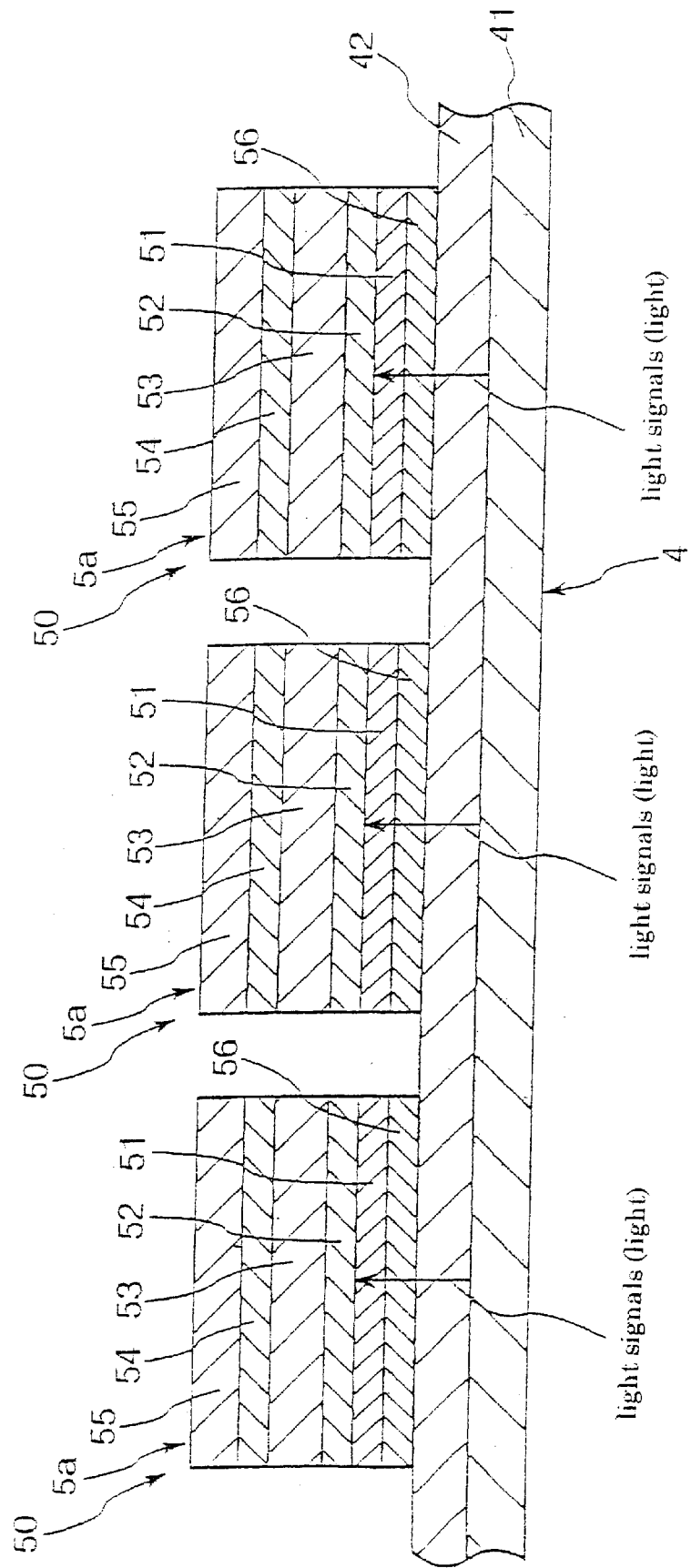
FIG. 12 is a cross-sectional view, taken along the line A—A in FIG. 11.

FIG. 11 is a cross-sectional view, showing a configuration of the light-receiving element 50 and the light-guiding path 4. FIG. 12 is a cross-sectional view, taken along the line A—A in FIG. 11.

As shown in the figure, each light-receiving element 50 is formed of a PIN photodiode 5a, which is made up of a light-receiving window electrode 51, a p-type a-SiC layer (p-type semiconductor layer) 52, an i-type a-Si layer (semiconductor layer) 53, an n-type a-SiC layer (n-type semiconductor layer) 54 and an Al—Si—Cu layer 55 used as a light-receiving top electrode as well as wiring (electric wiring), and an optical filter 56.

These optical filter 56, light-receiving window electrode 51, p-type a-SiC layer 52, i-type a-Si layer 53, n-type a-SiC layer 54 and Al—Si—Cu layer 55 are laminated successively from the bottom in FIG. 11. In this case, the optical filters 56 are formed so as to cover the light-receiving window electrodes 51.

Each light-receiving element 50 is provided on the light-guiding path 4 so as to let the light-receiving window electrode 51 face the ITO layer 42 of the light-guiding path 4 through the optical filter 56. Additionally, at the section corresponding to the light-receiving window electrode 51 of the light-guiding path 4, the $SiO_2$ layer 43 is not formed.

The material and the thickness of the light-receiving window electrode 51 are the same as those of the device 1 mentioned above.

Moreover, the thickness of the p-type a-SiC layer 52, the i-type a-Si layer 53, the n-type a-SiC layer 54 and the Al—Si—Cu layer 55 is also the same as those of the device 1 mentioned above.

When the peak wavelengths of the light from the light-emitting elements 30 are $\lambda 1$, $\lambda 2$ and $\lambda 3$ respectively, the optical characteristics of the optical filter 56 of each light-receiving element 50 are set so as to selectively transmit, at maximum, only the light from the corresponding light-emitting element 30 (the light having one of the predetermined wavelengths including $\lambda 1$, $\lambda 2$ and $\lambda 3$ as a peak wavelength).

As these optical filters 56, for instance, the above-mentioned distributed reflection multilayer film mirror (DBR mirror) may be used. As the DBR mirror is used as the optical filter 56, a narrower wavelength band can be selected than an optical color filter, thus increasing resolution in the longitudinal direction of wavelength.

As the organic EL element 3a mentioned above, the PIN photodiode 5a of each light-receiving element 50 can also be manufactured by ink jet printing. Specifically, at least one thin film (layer) constituting a PIN photodiode 5a can be manufactured by patterning a predetermined composition in the ink jet method and solidifying it as the above-noted organic EL element 3a of the device 1. In this case, the above-described effects by ink jet printing can be obtained.

Additionally, the thin films constituting the DBR mirror (optical filter 56) of each light-emitting element 50 may be also formed by the above-described liquid-phase film forming method.

More preferably, each DBR mirror may be manufactured by ink jet printing as the organic EL element 3a described above. Specifically, each thin film constituting each DBR mirror is preferably manufactured by patterning the composition in the ink jet method and solidifying it as the above-noted organic EL element 3a of the device 1. In this case, the above-described effects by ink jet printing can be obtained.

As illustrated in FIG. 9, the input side of each corresponding amplifying circuit 60 is connected to the PIN photodiode 5a of each light-receiving element 50 mentioned above.

Additionally, a predetermined circuit 8 is connected to the output side of each amplifying circuit 60, through each corresponding wiring 70.

The amplifying circuits 60 and the circuit 8 are the same as those of the above-described device 1, so the explanation of it is omitted.

This device 10 and the above-mentioned device 1 may be applied to a wide range of integration, including e.g., LSI transistors applying the final limit of the 0.18 $\mu$m rule to transistor circuits with the 2 to 3 $\mu$m rule such as TFT. Subsequently, the operation of the device 10 will be explained.

The organic EL element 3a of each light-emitting element 30 is driven by each of the above-mentioned driving circuits not shown in the figure, thus emitting light. Specifically, each organic EL element 3a sends (transmits) light signals (light). For a typical case, signal transmission with the peak wavelength of $\lambda 1$ will be explained below.

As shown in FIG. 10, from each light-emitting layer 32 of the organic EL elements 3a, light is emitted that has different wavelengths depending on the materials and structure of each light-emitting layer 32. Each light transmits the transparent electrodes 31 as indicated in the arrows in FIG. 10, and the band thereof is further narrowed at the optical filters 35, thus becoming light having the peak wavelength of $\lambda 1$, $\lambda 2$ and $\lambda 3$ and then being output from the optical filters 35.

Light having the peak wavelength of $\lambda 1$ output from the predetermined optical filter 35 (mentioned as "the light having a particular wavelength" hereinafter), in other words, light having a particular wavelength that transmitted the optical filter 35, transmits the $SiO_2$ layer 43 and enters the ITO layer 42. Then, the light is repeatedly reflected in an interface between the $SiO_2$ layer 41 and the ITO layer 42 as well as an interface between the $SiO_2$ layer 43 and the ITO layer 42, and travels inside the ITO layer 42 toward the PIN photodiode 5a.

As illustrated in FIG. 11 and 12, the light having a particular wavelength from the organic EL element 3a transmits only the optical filter 56 of the corresponding light-receiving element 50 as indicated by the arrows in FIG. 11 and FIG. 12, and enters from the light-receiving window electrode 51 of the PIN photodiode 5a of the corresponding light-receiving element 50. In other words, the light is received only at the corresponding PIN photodiode 5a.

Additionally, from the other two types of light-emitting elements 30, light with the peak wavelengths of $\lambda 2$ and $\lambda 3$ is emitted, respectively, and are guided to this light-receiving element 50 by the light-guiding path 4. However, each of both lights is cut off at the optical filter 56 of this light-receiving element 50 and is not received.

From the PIN photodiode 5a, the electric current corresponding to the quantity of received light, in other words, electric signals (signals) are output. (Light signals are converted into electric signals and are then output.) The signals from the PIN photodiode 5a are amplified at the amplifying circuit 60, and are input to the circuit 8 through the wiring 7. The circuit 8 operates based on these signals.

Additionally, the signal transfer of light with the peak wavelengths of $\lambda 2$ and $\lambda 3$ is also the same as above.

According to this device 10, like the above-described device 1, heating from the device 10 can be reduced. Moreover, the transfer delay of signals is significantly improved, thus providing a device (circuit) having excellent response properties. Also, the productivity of device 10 improves, which is advantageous to mass production.

Additionally, this device 10 has a plurality of light-emitting elements 30 having different peak wavelengths of light emission and a plurality of light-receiving elements 50 receiving the light (the light having a particular wavelength) from the corresponding light-emitting elements 30, so that a plurality of information may be transmitted at the same time by using the same light-guiding path 4. (Information transmission by multi-channel optical communication using the same light-guiding path 4 becomes possible.) Accordingly, compared with a device only with electric wiring, wiring can be simplified. Additionally, compared with a device only having electric wiring, the area occupied with wiring can be reduced, thereby reducing the size of a device having the same functions. In other words, the level of integration is increased.

Each light-emitting element 30 and each light-receiving element 50 in the device 10 is arranged in line horizontally. However, in the present invention, each of them may be arranged in line vertically as in FIG. 9.

Moreover, the optical filters 35 in the above-noted device 10 and the optical filters 56 are not limited to the DBR mirror in the present invention. Others, for example, optical color filters or the like may be used.

Furthermore, the light-emitting characteristics (particularly, the peak wavelength of emitted light) of the light-emitting elements 30 may be changed by eliminating the optical filters 35 and changing the light-emitting characteristics (particularly, the peak wavelength of emitting light) of the light-emitting layers 32 of the organic EL elements 3*a*.

Additionally, in the present invention, the light-emitting characteristics (particularly, the peak wavelength of emitted light) of the light-emitting layers 32 of the organic EL elements 3*a* may be changed without eliminating the optical filters 35.

Figure 13:
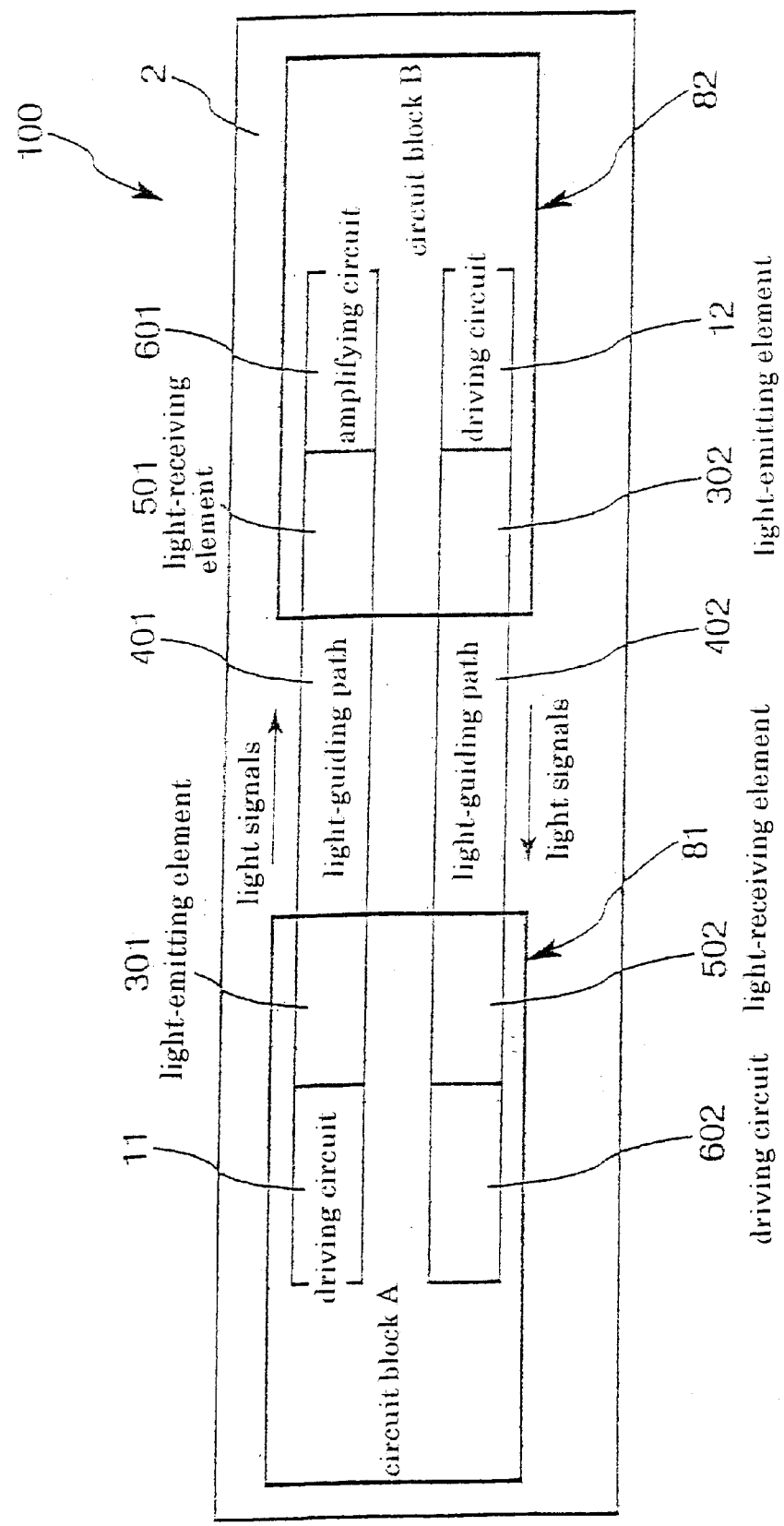
FIG. 13 is a type view, showing major sections of a device having a light transmission means of another embodiment of the present invention.

FIG. 13 is a figure (a figure showing the plan arrangement of members), showing an embodiment of a device 100 having a light transmission means of the present invention that is used when the above-described device 1 or 10 is actually built in a semiconductor circuit such as a LSI circuit and a TFT circuit.

As shown in the figure, on the same substrate 2, two circuit blocks 81 (A) and 82 (B) are provided (formed). The circuit block 81 has a light-emitting element 301, a driving circuit 11 for driving this light-emitting element 301, a light-receiving element 502, and an amplifying element 602. The circuit block 82 has a light-emitting element 302, a driving circuit 12 for driving this light-emitting element 302, a light-receiving element 501, and an amplifying element 601.

The light-emitting element 301 is connected to the light-receiving element 501 so as to transmit light to the light-receiving element 501 through the light-guiding path 401 provided on the substrate 2. Similarly, the light-emitting element 302 is connected to the light-receiving element 502 so as to transmit light to the light-receiving element 502 through the light-guiding path 402 provided on the substrate 2.

This device 100 can convert electric signals to light signals between the circuit block 81 and the circuit block 82 inside, and can send and receive the signals. Specifically, the light signals sent from the circuit block 81 can be received at the circuit block 82. Conversely, the light signals sent from the circuit block 82 can be received at the circuit block 81.

The same substrate materials as those of the device 1 mentioned above may be used for the substrate 2 of the device 100.

Additionally, for the light-emitting elements 301 and 302, the light-receiving elements 501 and 502 and the light-guiding paths 401 and 402 of the device 100, the same materials and structures as in the above-described device 1 may be applied. Moreover, the same manufacturing processes as those in the above-mentioned device 1 may be applied.

Also, the driving circuits 11 and 12 of the device 100 are usually electronic circuits using a bipolar transistor, a MOS-FET, or the like.

Furthermore, for the amplifying circuits 601 and 602 of the device 100, as in the above-described device 1, the electronic circuits shown in FIG. 5, FIG. 6, FIG. 7 and FIG. 8 may be used.

The operation of this device 100 is almost the same as that of the above-described device 1. However, the circuit blocks 81 and 82 can carry out transmission and reception respectively (particularly, in parallel). In other words, the transmission from the circuit block 81 to 82 and the transmission from the circuit block 82 to 81 can be carried out (particularly, in parallel), which is different from the device 1.

Additionally, in this device 100, as the above-mentioned device 1, only one type of light is used as light for generating light signals, but the light is not limited to this. Needless to say, as in the device 10 described above, transmission and reception functions using a plurality of lights having different peak wavelengths may be added. This can be achieved by appropriately combining the above-mentioned device 100 and the device described above.

A device having the light transmission means of the present invention is applied to a signal transmission device between circuit blocks (between a predetermined circuit block and another circuit block) in one semiconductor chip where a general semiconductor integrated circuit is used, and signal transfer device between a predetermined semiconductor chip and another semiconductor chip, a signal transfer device between a circuit board on which a semiconductor chip is mounted and a mounted chip, a signal transfer device between the predetermined circuit board mentioned above and another circuit board, and so forth.

Furthermore, a device having the light transmission means of the present invention may also be applied to a signal transmission device between TFT circuits (between a predetermined TFT circuit and another TFT circuit), and a signal transmission device between a TFT circuit and a general semiconductor circuit.

A device having the light transmission means of the present invention, particularly as the above-mentioned embodiments, is applicable to the devices sending signals to a flat panel display such as a liquid crystal display, a plasma display, an organic EL display, and the like.

Devices having the light transmission means of the present invention were explained above based on each embodiment in the figures, but are not limited to these. The structure of each section can be switched to an optional structure having the same functions.

For example, in each embodiment mentioned above, light-emitting elements, light-guiding paths and light-receiving elements are provided in a one-dimensional direction but may be provided in a two-dimensional direction (provided on a substrate in a two-dimensional direction) in the present invention.

Additionally, in the present invention, a light transmission means may have a plurality of light-emitting sections, light-receiving sections and light-guiding paths.

Furthermore, in the present invention, light-emitting elements, light-guiding paths and light-receiving elements may be provided in a three-dimensional direction. The embodiment thereof will be simply explained below based on FIG. 14.

Figure 14:
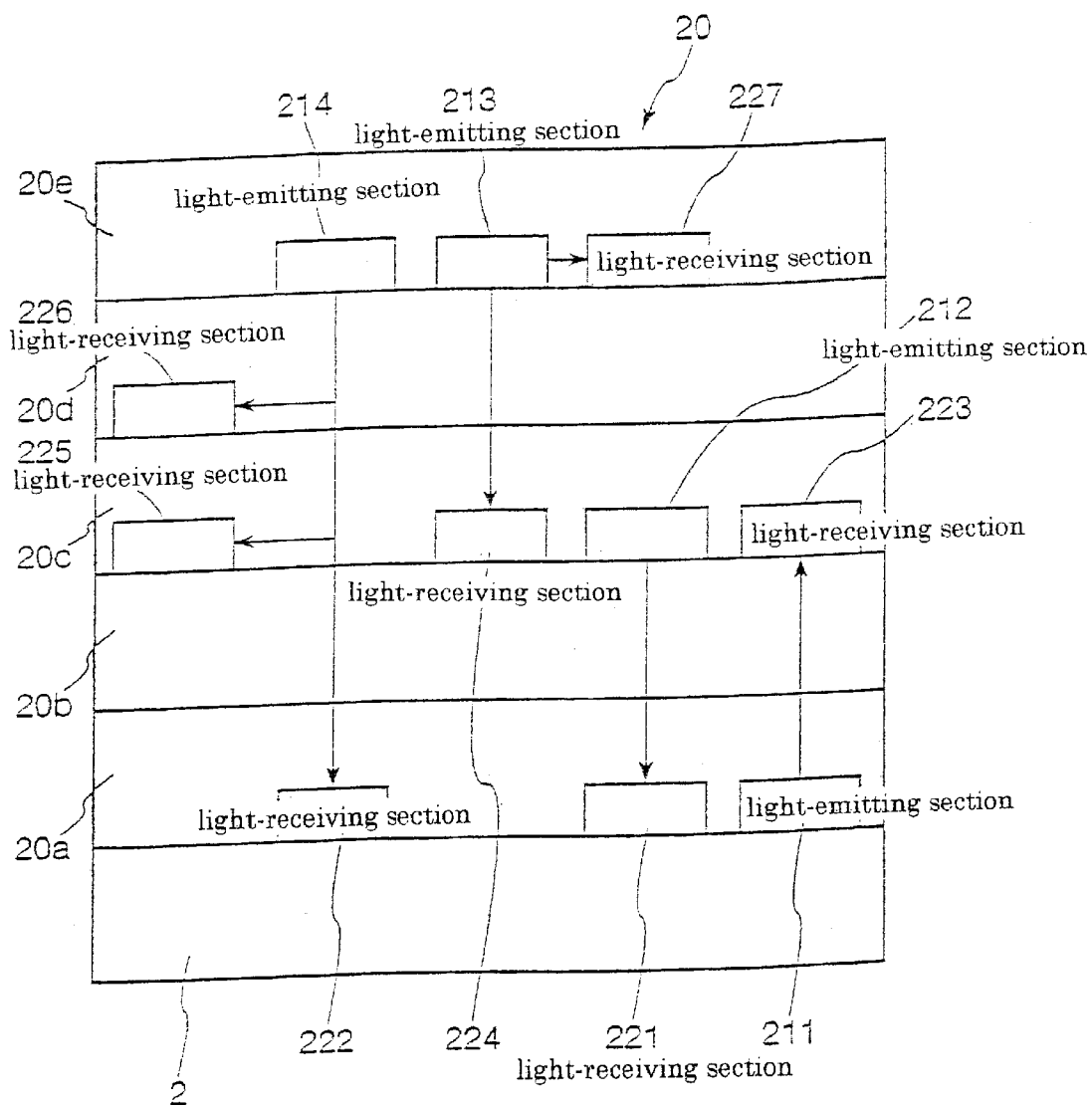
FIG. 14 is a type view, showing major sections of a device having a light transmission means of another embodiment of the present invention.

As illustrated in FIG. 14, this device (semiconductor device) 20 is a multilayer device wherein a first layer 20a, a second layer 20b, a third layer 20c, a fourth layer 20d and a fifth layer 20e are successively laminated on a substrate 2.

In this case, the relations between a light-emitting section 213 and a light-receiving section 227 in the fifth layer 20e are the same as the relations between the light-emitting section and the light-receiving section of the device 1 and the device 10 mentioned above.

Moreover, the relations between the light-emitting section and the light-receiving section of the device 1 and the device 10 mentioned above are the same as the relations between a light-emitting section and the light-receiving section that is connected to the light-emitting section through a light-guiding path not shown in the figure in different layers (in a perpendicular direction relative to the substrate 2), which are the relations between a light-emitting section 211 and a light-receiving section 223, the relations between a light-emitting section 212 and a light-receiving section 221, the relations between a light-emitting section 213 and a light-receiving section 224, and the relations between a light-emitting section 214 and a light-receiving section 222 and between 225 and 2264.

It is preferable to manufacture this device 20, for example, as follows:

First, the first layer 20a, the second layer 20b, the third layer 20c, the fourth layer 20d and the fifth layer 20e is formed on each predetermined substrate not shown in the figure.

Subsequently, the first layer 20a is separated from the substrate by a predetermined method, and is transferred onto the substrate 2. Similarly, the second layer 20b, the third layer 20c, the fourth layer 20d and the fifth layer 20e are then separated from the substrates and are successively laminated (transferred) while being aligned in a predetermined method. The method described in Laid-open Japanese Patent Application 10-125930 by the present applicant may be adopted for the detail of this method.

According to this device 20, the same effects as the above-mentioned device 1 and device 10 can be obtained. At the same time, integration may be easily improved.

Additionally, in the present invention, the number of layers constituting the device is not limited to five, and may be, for instance, two to four, or six or more.

In each embodiment as described above, a light-emitting element is made of an organic EL element. However, in the present invention, a light-emitting element is not limited to this, and may be formed of, for example, an organic EL element, a light-emitting diode (LED), a semiconductor laser (laser diode), and the like.

Moreover, in each embodiment mentioned above, a light-receiving element is made of a PIN photodiode, but is not limited to this in the present invention. A light-receiving element may be formed of, for instance, various photodiodes such as a PN photodiode and an avalanche photodiode, a phototransistor, a photoluminescence (organic photoluminescence), and the like.

Also, in the present invention, the above-described predetermined components in each embodiment may be appropriately combined.

As explained above, according to the device having the light transmission means of the present invention, information (signals) is transmitted mainly by optical communication in a device where fine elements are integrated, so that heating from the device can be reduced and the delay of signals can be significantly decreased. Thus, a device (circuit) having excellent response properties can be provided.

Moreover, when thin films constituting an element are patterned by the ink jet method, fine patterning can be easily, quickly and accurately carried out. Additionally, a film thickness can be easily and accurately adjusted by increasing or decreasing the discharge quantity of a composition, so that the properties and the like of a film can be easily and freely controlled thereby.

Thus, by the ink jet method, light-emitting and light-receiving elements and a semiconductor element may be easily made hybrid.

Accordingly, an element having preferable characteristics, size and patterns can be easily formed on a substrate (for instance, a Si monocrystal substrate or a substrate where fine elements are integrated such as a TFT circuit). Thus, the productivity of devices improves, which is advantageous to mass production.

Moreover, when a light-emitting section has a plurality of light-emitting elements having different light-emitting characteristics, a plurality of information may be transmitted at the same time by using the same light-guiding path particularly as the light-emitting section has a plurality of light-emitting elements having different peak wavelengths of emitting light. Accordingly, compared with a device with only electric wiring, wiring can be simplified. Additionally, compared with a device with only electric wiring, the area occupied with wiring can be reduced, and the generation of heat can be inhibited, thus increasing integration.

What is claimed is:

1. A device comprising: a light transmission device having a light-emitting section having at least one light-emitting element made of a thin film, a light-receiving section having at least one light-receiving element made of a thin film, and a light-guiding path that guides light from the light-emitting section to the light-receiving section, wherein the light-emitting section, the light-receiving section, and the light-guiding path being integrated.

2. The device according to claim 1, the light-emitting section, the light-receiving section and the light-guiding path being arranged in a three-dimensional direction.

3. The device according to claim 2, further comprising a layer having at least one of the light-emitting section, the light-receiving section and the light-guiding path, the layer being laminated.

4. The device according to claim 1, the light-emitting section having a plurality of light-emitting elements having different light-emitting characteristics.

5. The device according to claim 4, the light-receiving section having a plurality of light-receiving elements that receive light from corresponding the light-emitting elements.

6. The device according to claim 1, the light-emitting element being an organic EL element and an optical filter.

7. The device according to claim 6, the optical filter being a distributed reflection multilayer film mirror made of a plurality of laminated thin films having different refractive indexes.

8. The device according to claim 1, further comprising a plurality of circuit blocks on a same substrate, each of the plurality of circuit blocks comprising the light-emitting section and the light-receiving section.

9. The device according to claim 8, a gap between predetermined circuit blocks of the plurality of circuit blocks being connected by the light-guiding path, and signals being transmitted and received by light through the light-guiding path between the circuit blocks.

10. The device according to claim 1, the light-emitting section, the light-receiving section and the light-guiding path being arranged in at least a one-dimensional direction.

11. The device according to claim 1, the light-emitting section, the light-receiving section and the light-guiding path being arranged on a same substrate.

12. The device according to claim 1, the light-emitting section, the light-receiving section and the light guiding path being arranged in a two-dimensional direction.

13. The device according to claim 1, the light-emitting section having a plurality of light-emitting elements having different peak wavelengths of emitted light.

14. The device according to claim 1, at least one thin film constituting the light-emitting element being patterned by an ink jet method.

15. The device according to claim 1, the light-emitting element being an organic EL element.

16. The device according to claim 1, at least one thin film constituting the light-receiving element being patterned by an ink jet method.

17. The device according to claim 1, the light-receiving element being an organic element.

18. The device according to claim 1, the light-receiving element being an organic element and an optical filter.

19. The device according to claim 1, the light-guiding path including thin films.

20. The device according to claim 1, at least one thin film constituting the light-guiding path being patterned by an ink jet method.

21. The device according to claim 1, further comprising a thin film transistor.

* * * * *